(12) United States Patent
Joos et al.

(10) Patent No.: US 8,035,363 B2
(45) Date of Patent: Oct. 11, 2011

(54) PROCEDURE AND A SWITCHING ARRANGEMENT FOR TRIGGERING A LOAD ELEMENT USING AN ELECTRONIC SWITCHING ELEMENT IN A LOAD CIRCUIT

(75) Inventors: Uli Joos, Nonnenhorn (DE); Armin Lenk, Ostrach-Magenbuch (DE)

(73) Assignee: Conti Temic Microelectronic, GmbH, Nurnberg (DE)

( * ) Notice: Subject to any disclaimer, the term of this patent is extended or adjusted under 35 U.S.C. 154(b) by 423 days.

(21) Appl. No.: 10/582,462

(22) PCT Filed: Dec. 10, 2004

(86) PCT No.: PCT/DE2004/002715
§ 371 (c)(1),
(2), (4) Date: Jun. 12, 2006

(87) PCT Pub. No.: WO2005/057788
PCT Pub. Date: Jun. 23, 2005

(65) Prior Publication Data
US 2007/0103133 A1    May 10, 2007

(30) Foreign Application Priority Data
Dec. 11, 2003   (DE) .................. 103 58 276

(51) Int. Cl.
*G05F 1/00* (2006.01)
*H03K 17/687* (2006.01)
(52) U.S. Cl. ......... 323/282; 323/268; 323/271; 327/427
(58) Field of Classification Search .................. 323/222, 323/282, 288, 289; 327/220, 427
See application file for complete search history.

(56) References Cited

U.S. PATENT DOCUMENTS

| 5,479,086 | A | * | 12/1995 | Konstanzer | .................. 323/238 |
| 6,094,086 | A | | 7/2000 | Chow | |
| 6,747,505 | B1 | * | 6/2004 | Gergintschew | ............... 327/404 |
| 6,784,721 | B2 | * | 8/2004 | Torrisi et al. | .................. 327/434 |
| 2001/0040470 | A1 | | 11/2001 | Brando et al. | |

FOREIGN PATENT DOCUMENTS

| DE | 42 29 342 A1 | 3/1994 |
| DE | 43 30 996 A1 | 3/1995 |
| DE | 44 13 546 A1 | 10/1995 |
| DE | 196 19 399 A1 | 11/1997 |
| DE | 198 48 829 A1 | 5/2000 |
| DE | 199 45 432 A1 | 4/2001 |
| DE | 100 61 563 A1 | 3/2002 |
| DE | 101 43 432 C1 | 2/2003 |
| EP | 0340731 A2 | 11/1989 |

* cited by examiner

*Primary Examiner* — M'Baye Diao

(57) ABSTRACT

A procedure for triggering a load element using an electronic switch element is presented, in which voltage on the load element is controlled with a maximum specified increase. The increase does not remain constant, but is controlled via the switching procedure in dependence on the effectively occurring power loss or a value which is dependant on it (Ua/Ubat), preferably in several phases, whereby preferably at the beginning and the end of the switch-over procedure in the phase where the output voltage changes, the increase is selected as being low relative to the increase in the middle phase, since as a result, the power loss is only insignificantly raised, yet the high-frequency interferences can be noticeably dampened.

19 Claims, 8 Drawing Sheets

PROCEDURE AND A SWITCHING ARRANGEMENT FOR TRIGGERING A LOAD ELEMENT USING AN ELECTRONIC SWITCHING ELEMENT IN A LOAD CIRCUIT

BACKGROUND OF THE INVENTION

The invention relates to a procedure for triggering a load element, such as an essentially ohmic load element, using an electronic switching element (S1) in the load circuit, wherein the voltage (Ua) on the load element is controlled with a maximum specified increase.

The triggering, in particular also of many essentially ohmic electric loads in a motor vehicle (e.g. lamps, heating coils, etc.) is achieved using pulse width modulation (PMW). Here, the power delivered to the load can be regulated or controlled, whereby the losses in the control electronics can be kept to a low level using the switching operation.

With the pulse width modulated triggering of loads in motor vehicles, however, electromagnetic fields are emitted via the battery and load wires, which may then interrupt the radio reception in the vehicle.

For this reason, limit values have been specified in different standards (IEC, ISO, CISPR) which reduce the influence on the radio receiver in the corresponding spectra to an acceptable level.

The suppression of the alternating currents on the feed wires is usually achieved using low-pass filters (LC) in the input wires. The size and the cost of the filters depend on the current carrying capacity, the damping required, the quality and the limit frequency. The PWM is normally generated in motor vehicle control units via for a plurality of load elements by timer modules which are integrated into the microcontroller, whereby all PWM outputs switch on at the same point in time, and switch off at different points in time, depending on the PWM pulse-width repetition rate.

This procedure has the disadvantage that a very large alternating current is taken from the network, and that as a result, high demands are required of the filters used, in particular the storage capacitors.

FIG. 1 shows a diagram of a replacement circuit for the switch in PWM mode. Here, any load required (in this example, a filament lamp) is triggered via a switch (such as an N-MOSFET or bipolar transistor) using the signal in a pulse-modulated manner in a switching frequency range of 25 Hz-500 Hz. Depending on the switching condition of the switch, current is either taken from the network or not during the process. The time sequence of the input and output flow is shown subsequently in FIG. 2.

The current gradients which occur generate high-frequency current shares on the feed wires, which themselves cause faults in the LW, MW and SW (150 kHz to 10 mHz) radio frequencies.

Standard procedures dampen the high-frequency alternating currents on the feed wires with filters in the input and output wires, as shown below in FIGS. 3 to 5.

The disadvantage of the filter is its high costs and space requirements, however, which can make the electronics more expensive and fail to miniaturise them (integration in silicon).

A further option for reducing the electromagnetic radiation is to reduce the switching speed in the switch, which enables the high-frequency current shares to be reduced to the required size. Here, however, switching losses with reduced switching speed increase, which are unwanted due to the fact that they heat up the electronic system. FIG. 8 illustrates the switching sequence based on the output voltage with a so-called "constant slew rate", together with the losses which arise within the "active phase" of the electronic switches. It is already known, for inductive load elements in particular, that the increase of the edge of the switch can be altered in relation to time via the switching sequence, in order to reduce the power loss. Here, however, the edge of the switch is altered according to fixed, specified points in time. In DE 44 13 546 A1, furthermore, with an inductive load with a free wheeling circuit, the edge of the switch is altered in relation to the switching condition of the switch element. This procedure is also known from US-A-2001/0040410.

The object of the invention is to present a procedure of the type initially described, in particular also for ohmic load elements, and to improve the procedure known to date with regard to the switching time, the power loss and the interfering radiation, i.e. to further reduce the interferences, for example, without increasing the power loss, or to reduce the switching time and power loss while maintaining the existing interfering radiation. This object is attained by a method for triggering a load element using an electronic switching element (S1) in a load circuit. The method includes controlling a voltage (Ua) on the load element with a maximum specified increase and recording, during a switching procedure, an effectively occurring power loss or a related value (Ua/Ubat), wherein the effective increase (I1+I2+I3) is controlled dependently on the recorded power loss.

The invention is based on the knowledge that in order to positively influence the high-frequency interference spectrum, it is sufficient to lower the inclination in the area which is non-critical for the power loss at the beginning and the end of the switching procedure, i.e. to work there with a delay which lies below the delay in the active phase, while on the other hand, to utilise a high increase in the active area with high power loss, i.e. a short switching time.

This procedure is oriented in particular on the triggering of an essentially ohmic load element, i.e. with a negligible inductive or capacitive share. Using an electronic switching element in the load circuit, the voltage on the load element is controlled with a maximum specified increase, whereby during the switching procedure, the power loss currently occurring or a value which depends on it is recorded during the switching procedure, and the effective increase is controlled in dependence on it.

This is preferably achieved in such a manner that during the switching procedure, the effective ratio between the voltage on the load element and the supply voltage (Us/Ubat) is recorded, whereby at least for certain value ranges of the ratio (Ua/Ubat), assigned increase values are specified, and the increase is adapted accordingly during the switching procedure.

The increase values can be specified in the form of specific current values, for example, which are fed to a gate in a MOSFET transistor as an electronic switching device.

The present invention influences the edges in the switch element in such a manner, that the build-up speed
  is high in the phase in which the power loss is high
  is low in the phase in which the power loss is low A procedure results for triggering a load element using an electronic switch element in the load circuit, whereby the switching procedure is completed in at least three phases. In the first phase, the output voltage is controlled up to a first specified threshold value (e.g. 15%), with a maximum of one first increase; in the subsequent phase, the output voltage is controlled up to a second specified threshold value (e.g. 85%) with a maximum of one second increase; in the third subsequent phase, it is controlled again with a maximum of the first increase, whereby the second increase is greater than the first increase.

This procedure can preferably be further refined by several intermediate stages in such a manner, for example, that the switching procedure is completed in five phases, whereby in the first phase, the output voltage is controlled up to a first, specified threshold value (e.g. 10%) with a first increase in the second phase, the output voltage is controlled up to a second, specified threshold value (e.g. 20%) with a second increase in the third phase, the output voltage is controlled up to a third, specified threshold value (e.g. 80%) with a third increase in the fourth phase, the output voltage is controlled up to a second, specified threshold value (e.g. 90%) with the second increase in the final, fifth phase, the output voltage is controlled up to a supply voltage with the first increase whereby the third increase is larger than the second increase, which is in turn larger than the first increase

BRIEF DESCRIPTION OF THE DRAWINGS

The invention will now be described in greater detail below with reference to the exemplary embodiments and drawings, in which.

DETAILED DESCRIPTION OF THE DRAWINGS

The present invention is based on further, active influencing of the switch edges in the switching facility in such a manner, that in the middle phase of the switching procedure in which power losses occur, a high increase is used, thus achieving a rapid bypass of this phase, while in the phases at the beginning and end of the switching procedure, in which hardly any power loss arises, the switch edge runs far more slowly. The phase of the increase is to be understood here as being in accordance with the amount of the gradient of the progression of the output voltage, and the progression when switching off should be shown with negative preliminary mathematical signs accordingly.

Figure 14:
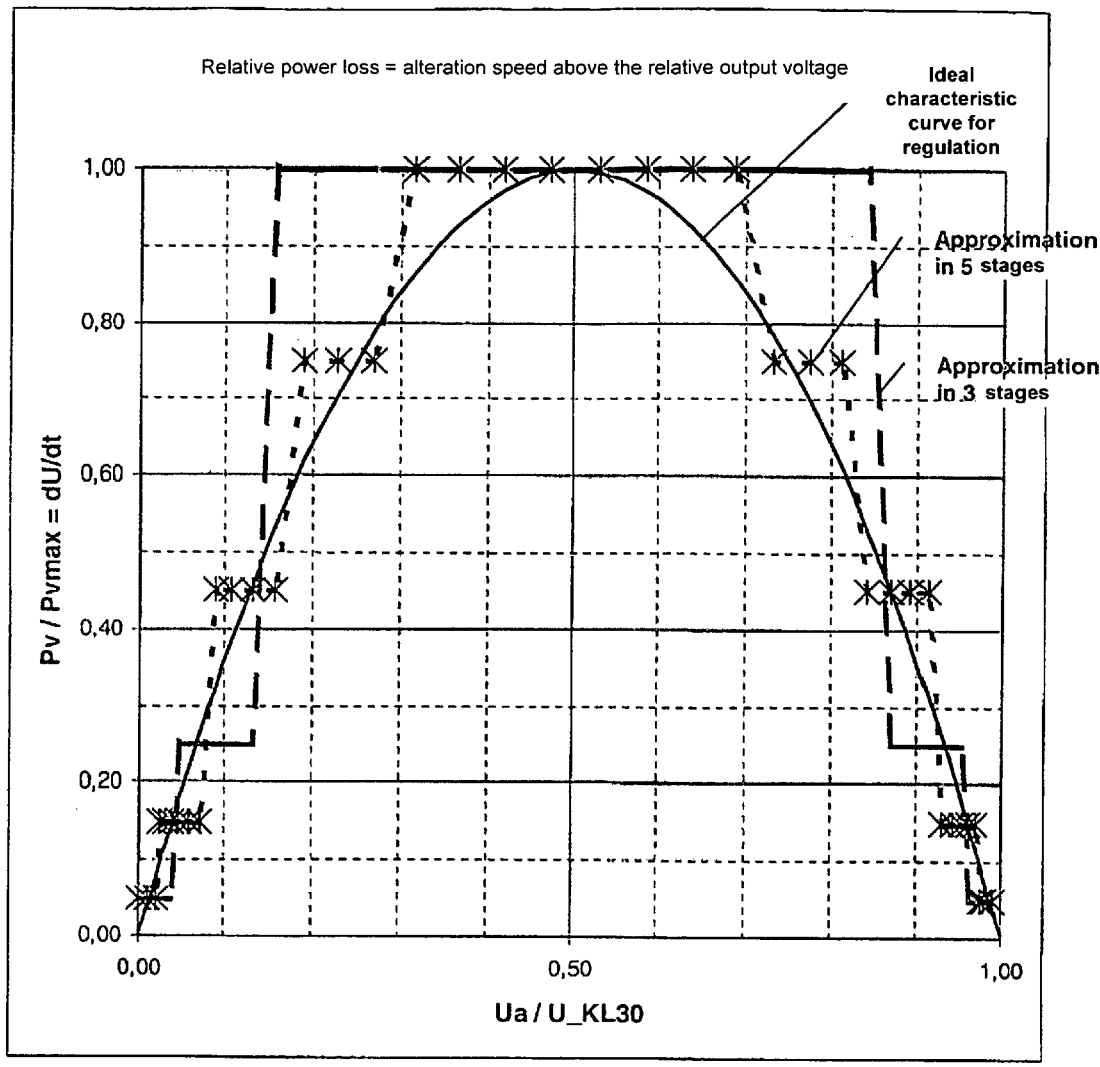
FIG. 14 shows the relative power loss which depends on the output voltage.

FIG. 14 clearly shows this interrelationship. The switching resistance of the switching device is known to vary above the switching procedure. Depending on the switching resistance, a relative output voltage results, Ua/Ubat. FIG. 14 now shows the relative power loss Pv/Pvmax which has been added above this relative output voltage. The greater the effective power loss, the more quickly this phase must be left behind. In other words, the greater the effective relative power loss, the higher the switching speed has to be. The ideal switching speed is therefore proportionate to the effective power loss. A quadratic ideal characteristic curve results for the increase to be specified. The regulation according to this ideal characteristic curve is extremely complex, however, and is therefore preferably approximated in several stages. The broken curve approximates the optimum form over 3 stages, with the curve marked with stars approximating the optimum form over 5 stages. The increase, and therefore the switching speed, is thus controlled over the entire switching procedure with the corresponding approximation in accordance with the relative power loss which currently occurs.

For this object, a triggering mechanism in at least three phases is suitable, whereby the increase in the middle phase is significantly higher than in the first and third phases, whereby the increase does not also need to be constant within the phases, but can also be adapted in stages or continuously. Here, the sole decisive factor is that during the middle phase, the increase is significantly higher overall than in the first and third phases. Accordingly, reference is also made in the phases to a maximum increase.

Figure 8:
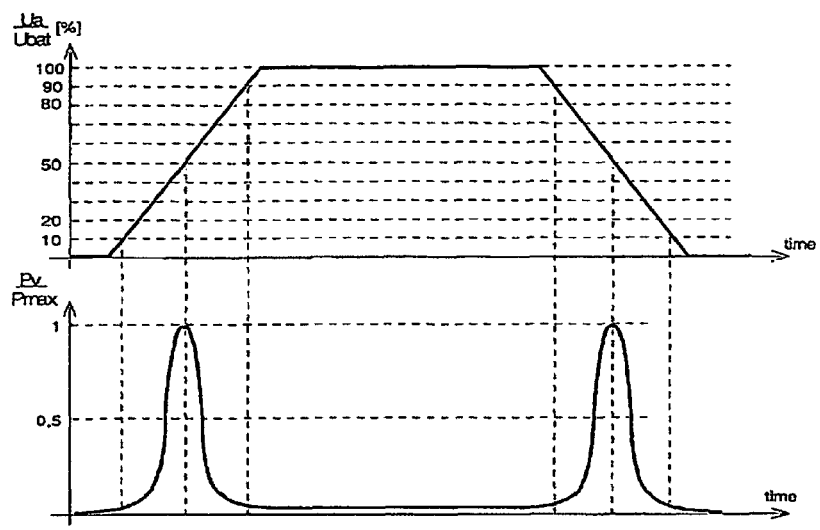
FIGS. 8,9 show the switching behaviour, power loss and frequency spectrum for triggering with a constant increase.
Figure 9:
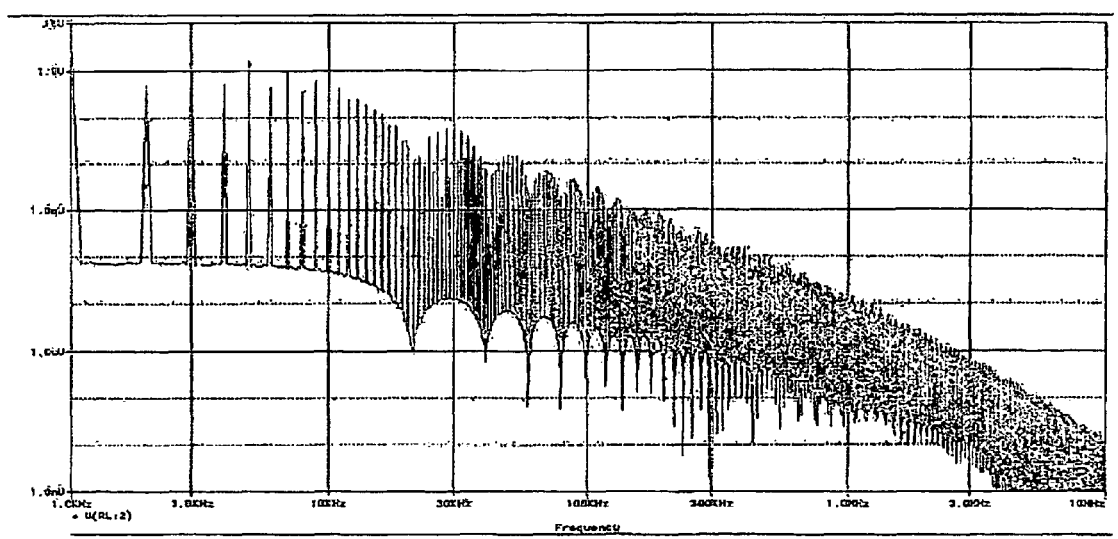
Figure 10:
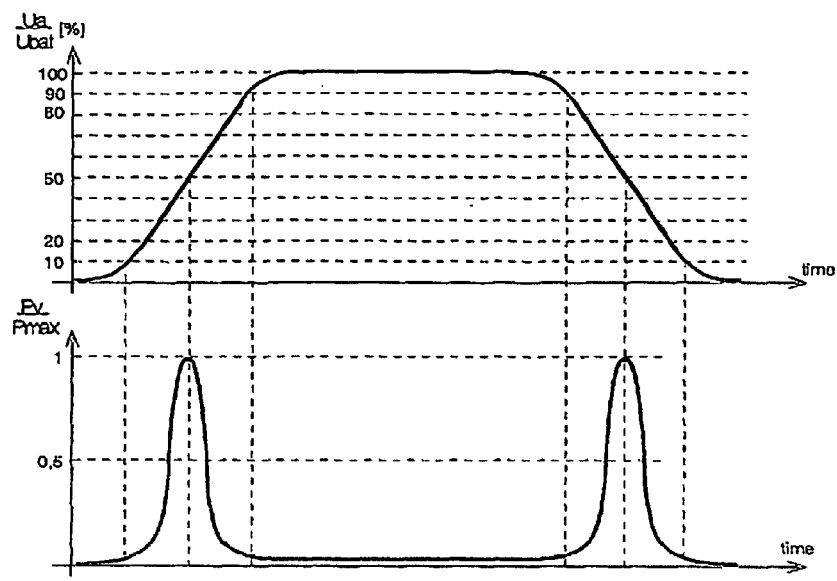
FIGS. 10,11 show the switching behaviour, power loss and frequency spectrum for a triggering mechanism according to the invention with an increase which depends on the power loss, i.e. a greater delay=lower increase at the beginning and end of the transition phase, as can be seen here by way of the rounded transitions, whereby the power loss remains approximately the same, although the frequency spectrum shows significantly lower interferences in the HF range.
Figure 11:
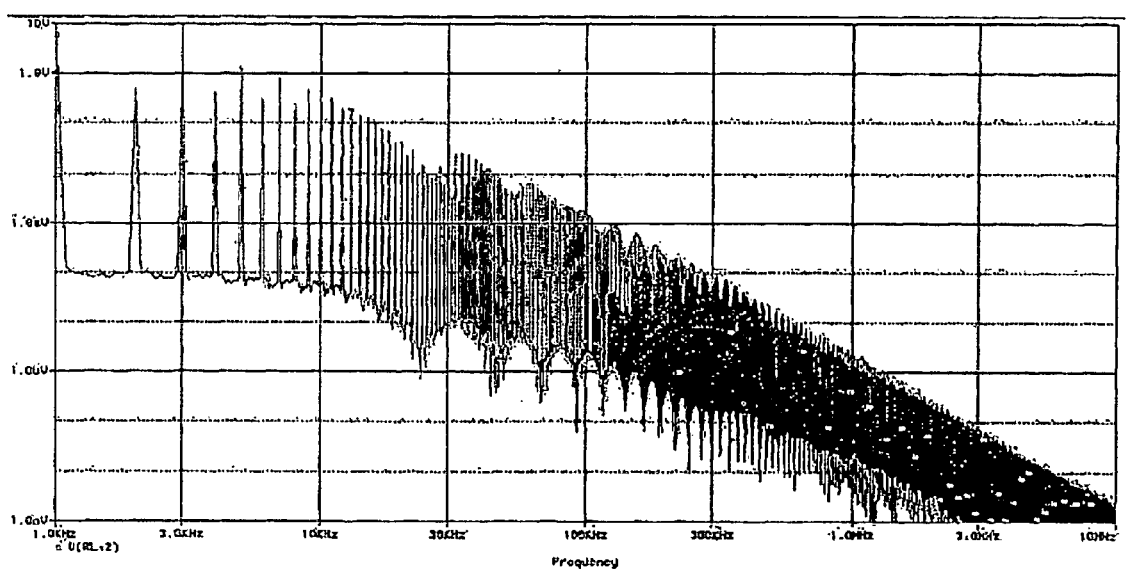

In this way, the spectrum emitted can be reduced in the high-frequency ranges, without significantly increasing the switching losses. The resulting progression of the output voltage in the switching procedure is shown in principle in FIG. 10. Both the switching time and the power loss approximately correspond to the prior art example shown in FIG. 8. The flattening of the edges in the beginning and end phases of the switching procedure outside the critical loss phase already leads to a significant reduction in high-frequency interferences, however, as can be seen from FIGS. 9 and 11.

Figure 1:
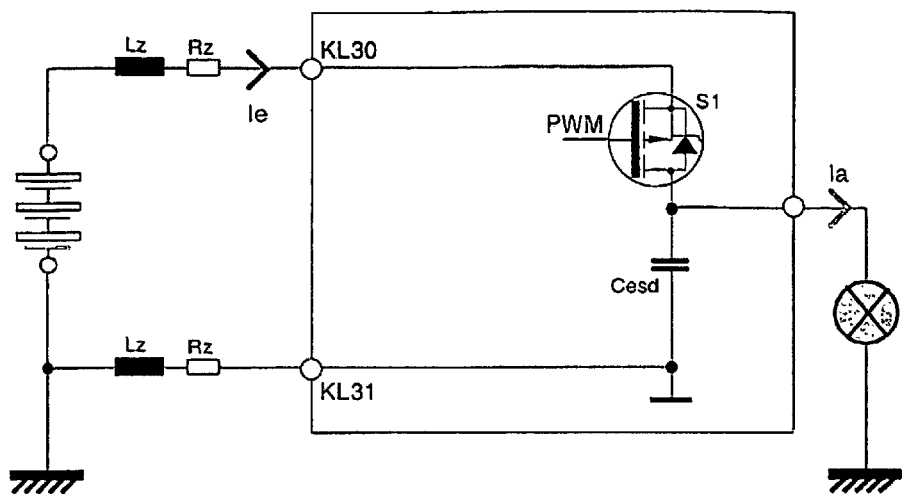
FIG. 1 shows a replacement wiring connection diagram of a PWM triggering mechanism according to the prior art.
Figure 2:
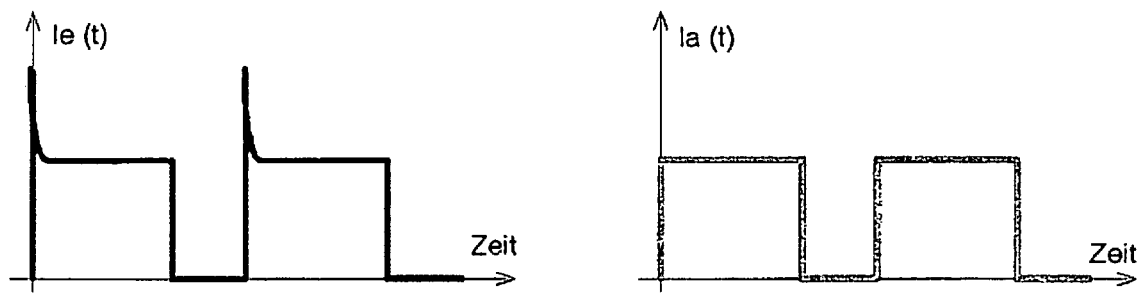
FIG. 2 shows the edges of the switches in FIG. 1.
Figure 3:
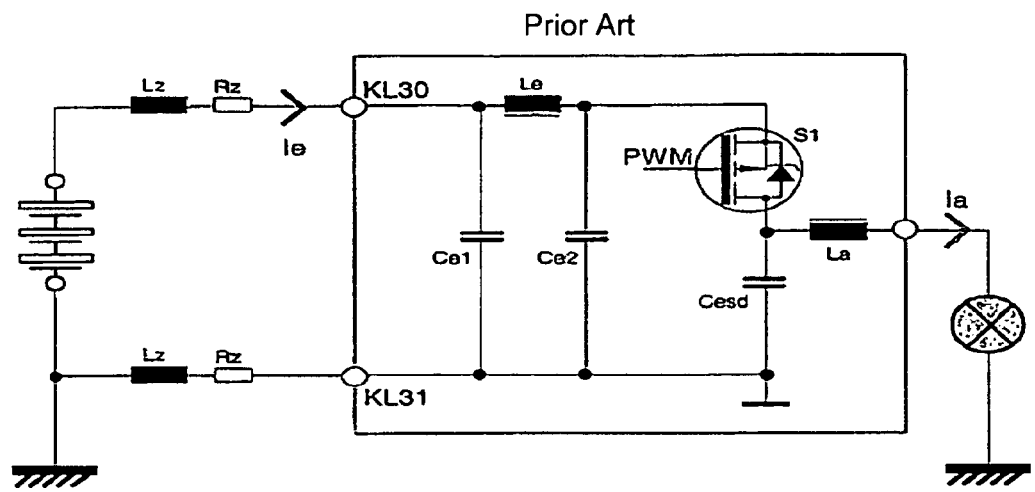
FIGS. 3-5 show filter circuits for damping the interferences according to the prior art.
Figure 4:
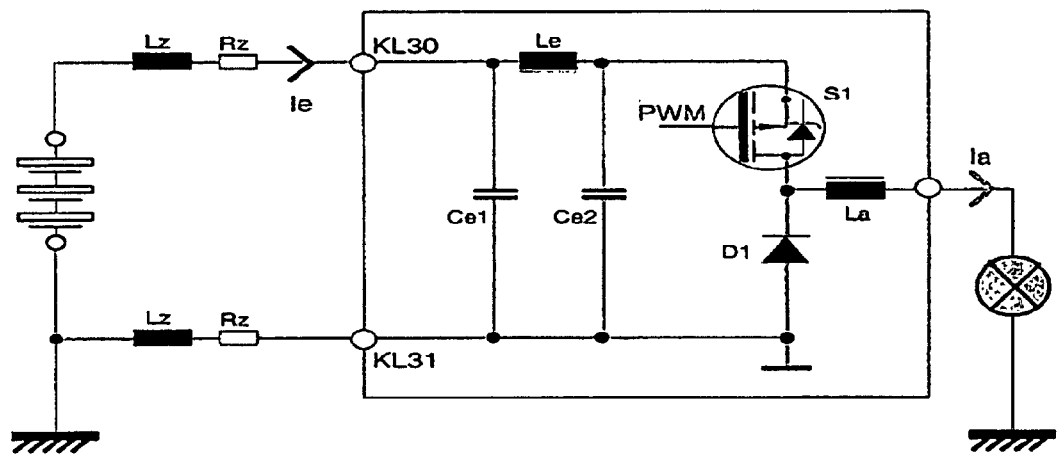
Figure 5:
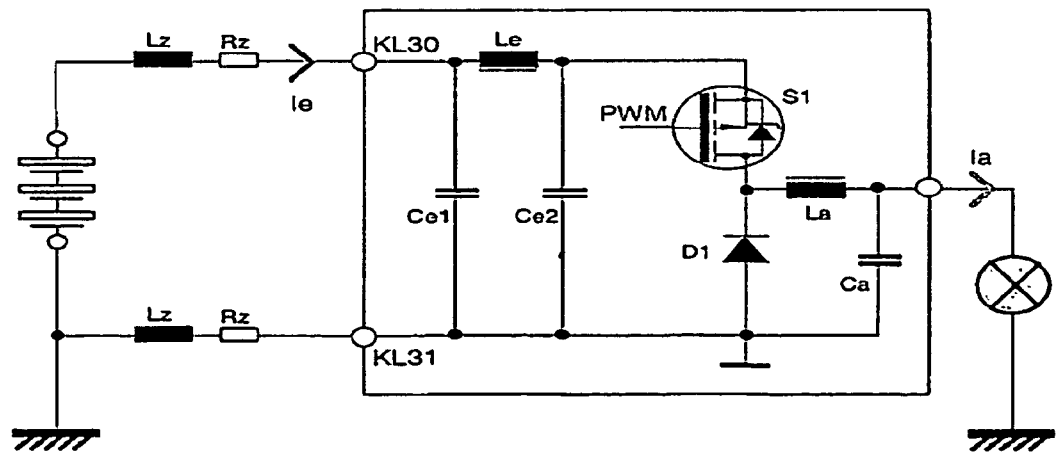
Figure 6:
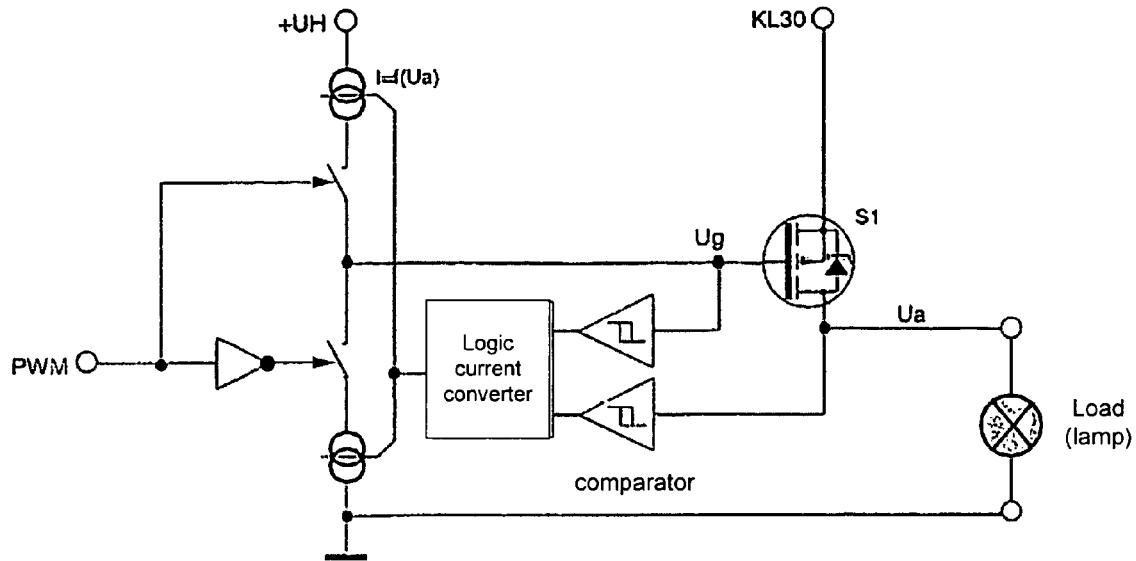
FIGS. 6-7 show a replacement wiring connection diagram of a switching arrangement with edge control in dependence on the voltage on the load element, and preferably also the voltage on the control input for MosFET or bipolar transistor switching devices.

A possible realisation of this switching procedure with a MOSFET switch is shown in FIG. 6, whereby the gate is subjected to a different level of current in dependence on the voltage on the load element during switching, thus adapting the increase within the switching procedure. Therefore, in the middle phase of the switching procedure, which is critical in terms of power loss, the current and thus the increase is higher than during the beginning and end phases. Here, controllable current sources and the corresponding control logic can provide a highly precise specification of the transitions, and if necessary, a very fine adaptation can be made. The supply voltage is here labelled as terminal 30 (KL30) of the connection terminal commonly used for the supply on-board network. The supply voltage, UH, for the controllable current sources can here lie slightly above the potential on the terminal 30, in order to be able to provide the gate-source voltage required for controlling purposes.

Figure 7:
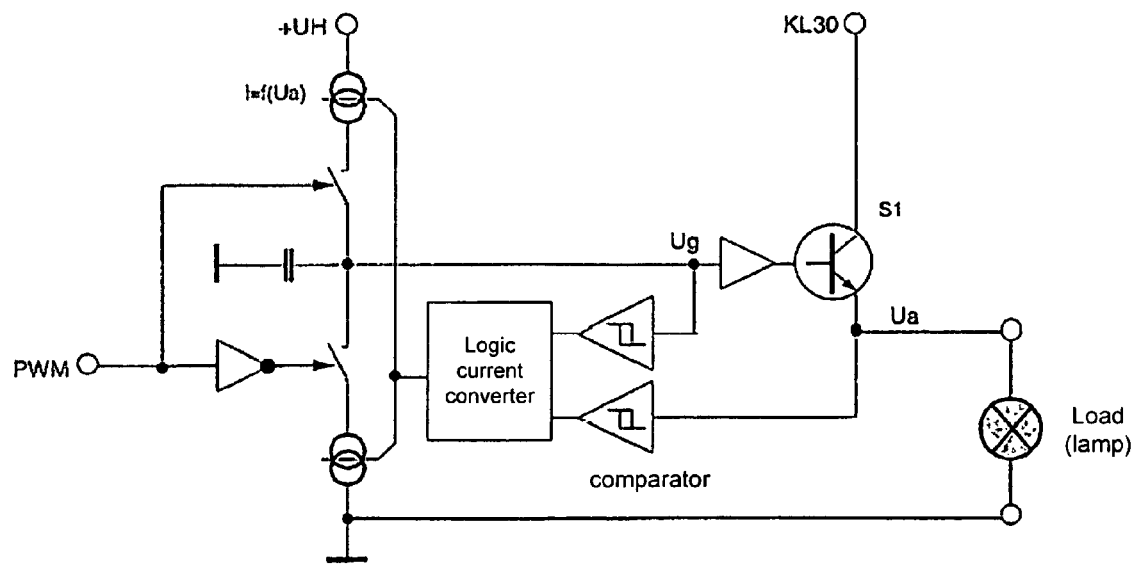

A realisation with a bipolar power switch is also feasible, as shown in FIG. 7. Here, the control current is integrated with a capacitor, and this voltage is controlled with a buffer amplifier based on the bipolar transistor: here, the current is routed into the gate, and thus the speed of alteration of the switching transistor is routed in dependence on the condition of the output voltage Ua and/or the gate voltage Ug.

In the phases in which the speed of alteration and thus the switching speed is high, a higher current is available on the gate. In the phases in which the speed of alteration is low, only a low level of control current is available on the gate.

The condition of the relevant signals, Ua and Ug, is here preferably recorded with comparators and the gate control currents are controlled via a logic to current converter.

Here, a higher current level is available when
1. Ug<Vp (when in switched off condition)
2. Ug>KL30+Vp (when in switched on condition)
3. UtrI<Ua<Utrh (during the switch edge)

The realisation of the current triggering can either be achieved digitally via 2 or more switched current sources, or in analogue mode using current sources which can be modulated.

A practical exemplary embodiment and the related principle curves are subsequently shown in FIG. 12.

Figure 12:
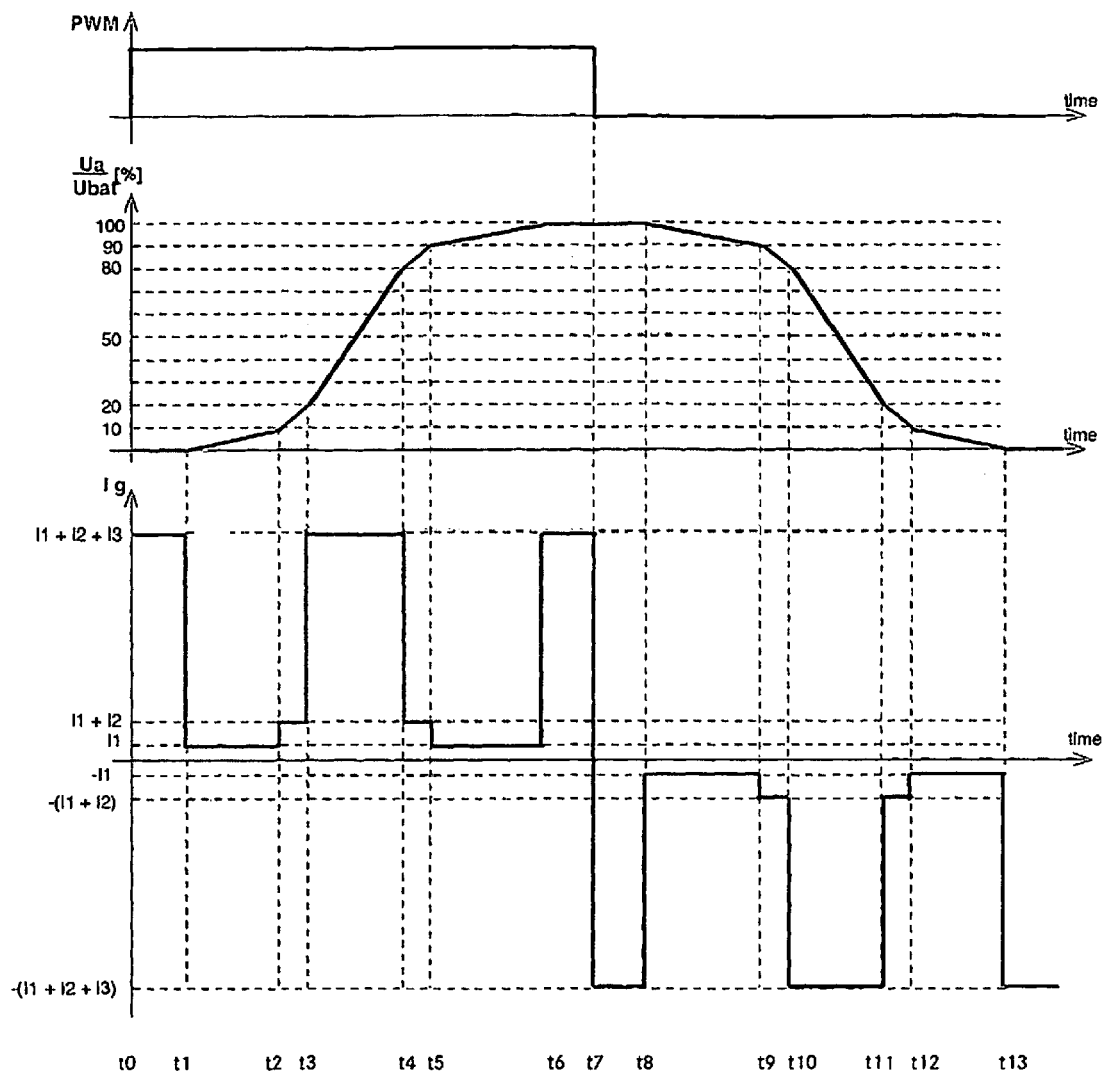
FIG. 12 shows a triggering mechanism in a multiple-stage, current-controlled procedure.
Figure 13:
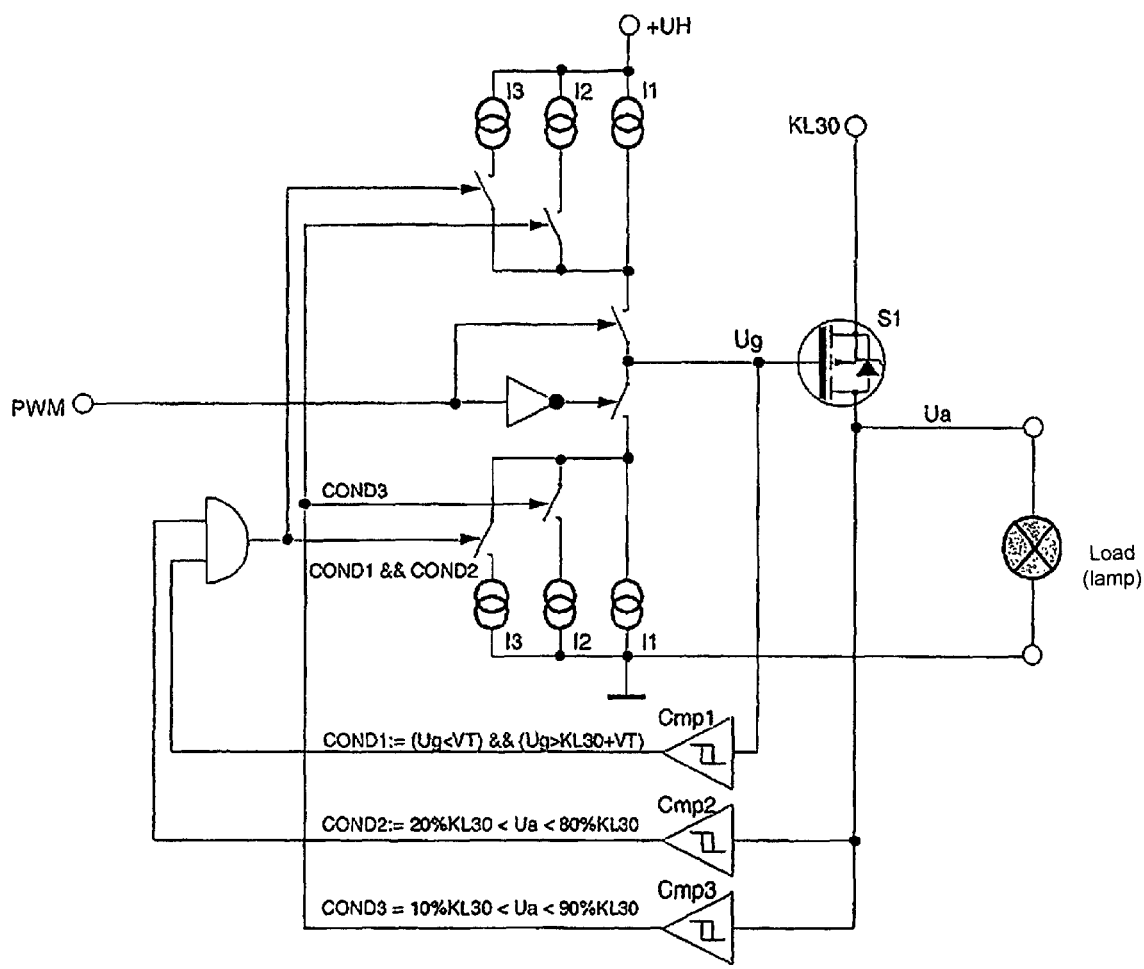
FIG. 13 shows a switching arrangement for completing the procedure according to FIG. 12.

The condition of the triggering voltage itself is recorded with the comparator Cmp1, and the output voltage Ua is recorded with the comparators Cmp2 and Cmp3 and, depending on the switching condition of the comparators, the current is routed into the gate of the switching transistor S1 over the switchable current sources in such a manner, that
- the current is high when in switched on and switched off condition (COND 1), so that in these phases, in which the voltage on the output is constant (in FIG. 12 t0-t1, t6-t7, t7-t8), and there is therefore no influence on the HF behaviour, the switching time is further reduced, rather than using the long increase
- in the phase when the supply voltages begin to be changed, the current is low (none of the conditions are fulfilled in FIG. 12 t1-t2, t5-t6 etc.), since here, the high-frequency interferences occur, but the power loss is still very low
- and during the switching procedure itself (COND 3), the current is high again, since the power loss is high (in FIG. 12, t3-t4 and t10-t11)

As an intermediate stage (COND 2) between the phases around the supply voltages, i.e. when the output voltage begins to deviate from zero volts or from the supply voltage, a phase with a slightly increased level of current is inserted (t2-t3, t4-t5) during the switching procedure in the example given, in order to make the transitions "softer". The transitions between the phases can be dampened to improve the rounding of the current progression with RC elements.

The length, height and number of stages of the triggering currents, together with the precise position of the comparator thresholds, can be adapted to the corresponding requirements of the switching, and can ideally be parameterised.

The procedure leads to a reduction in electromagnetic radiation in the radio frequency ranges of pulse-width modulate triggering mechanisms by systematically influencing the switching speed.

The control of the speed of alteration of the switching state can be achieved in dependence on the condition of the output voltage Ua and/or the control voltage Ug, and the PWM control signal can activate the corresponding time control.

The triggering current of the switch is controlled in dependence on the output voltage in such a manner that the effective switching speed forms an optimum between the switching power loss and the electromagnetic radiation.

The control of the triggering current of the switch is therefore additionally achieved in dependence on the gate voltage in such a manner that the switching delay remains low. For this purpose, even before the voltage on the load element changes, the voltage at the gate is quickly established with a high current, which does not yet affect the output of the switching device and thus also the HF interferences. A voltage on the control input Ug of the switching device is therefore monitored (COND 1). In the first main phase, a current value above the first current value is fed in as long as the voltage on the control input is lower (t0-t1) than a specified threshold voltage (VT), which approximately corresponds to the pinch-off voltage of the switching device in question. In the same way, in the third (main) phase, the current value is increased again (t6-t7), when the voltage on the control input is lower than the difference between the supply voltage (Ubat) and the threshold voltage (VT).

The control of the triggering current can either be achieved digitally using switched current sources, or in analogue mode using current sources which can be modulated.

Preferably, the switching arrangement is designed to adapt the switching speed to different configurations (wire length, cabling, current, switching frequency, etc.) in such a manner that it can be parameterised.

In a particularly advantageous manner, the invention is directly integrated into an intelligent power switch. Here, the space and cost savings are particularly high.

The procedure and the switching arrangement are particularly suitable for triggering lamps as essentially ohmic loads, in particular for motor vehicles.

The invention claimed is:

1. A method for triggering a load element using an electronic switching element in a load circuit, the method comprising:
    controlling a voltage on the load element with a maximum specified increase;
    recording, during a switching procedure, an effectively occurring power loss or a related value, wherein the effective increase is controlled dependently on the recorded power loss; and
    wherein the triggering is achieved such that during the phase of high power loss, the voltage is adapted with the maximum specified increase, and the increase at the beginning and the end of the switching procedure is lower than the maximum increase.

2. A method according to claim 1, wherein during the switching procedure, an effective ratio between the voltage on the load element and the supply voltage is recorded, assigned increase values are specified at least for specific value ranges of the ratio, and the increase is adapted accordingly during the switching procedure.

3. A method according to claim 1, wherein the electronic switch element is a transistor switch with an active phase, and first and second threshold values are specified in such a manner that the first and second threshold values approximately localise the active phase, and the transistor switch is controlled within this active phase with the second, higher increase.

4. A method according to claim 1, wherein the electronic switch element is a transistor switch with an active phase, and that first and second threshold values are specified in such a manner that a specified maximum power loss for each switching procedure, and a specific maximum electromagnetic interfering radiation level cannot be exceeded.

5. A method according to claim 1, wherein a voltage on the load element in relation to a supply voltage is recorded as a proportional value, and corresponding voltage values are specified as first and second threshold value, from which point on the load element is controlled according to the specified maximum increases.

6. A method according to claim 5, wherein the first threshold value is between 5% and 30% of the supply voltage (Ubat), and the second threshold value is between 70% and 95%.

7. A method according to claim 6, wherein the first threshold value is approximately 15% and the second threshold value is approximately 85%.

8. A method according to claim 1, wherein between the first and second phase, at least one intermediate phase is provided, in which the voltage is raised by an increase value which lies between the maximum increase in the first phase and the maximum increase in the second phase.

9. A method according to claim 8, wherein the switching procedure is completed in three main phases and two intermediate phases, whereby:
- in a first main phase the output voltage is controlled up to a first specified threshold value with a first increase;
- in a second intermediate phase, the output voltage is controlled up to a second specified threshold value with a second increase;
- in a second main phase, the output voltage is controlled up to a third specified threshold value with a third increase;
- in a second intermediate phase, the output voltage is controlled up to a second specified threshold value with the second increase; and
- in the a main phase, the output voltage is controlled up to the supply voltage with the first increase, wherein the third increase is larger than the second increase, and that is in turn larger than the first increase.

10. A method according to claim 1, wherein the voltage on the control input (Ug) of the switching device is monitored, and wherein an effective current increase a current value is above the first current value for as long as a voltage on the control input is either lower than a specified threshold voltage or higher than the difference between the supply voltage and the threshold voltage.

11. A switching arrangement for triggering a load element, the arrangement comprising:
- an electronic switching element in a load circuit, wherein the input of the electronic switching element is current controlled;
- a control unit connected to an input of the switching element;
- a load element connected to a load output of the switching element, wherein the control unit records a switching condition of the switch element, and in dependence on a triggering signal and the switching condition, controls the switch element in such a manner that a voltage on the load output is controlled in three phases with a restricted increase, wherein an increase in the second, middle phase is lower in value than an increase in the other phases; and
- wherein, depending on the triggering signal and the switching condition on the control input, in the first phase, a first current value is fed in, in the second phase, a second current value is fed in, and in the third phase, a third current value is fed in, and the first current value and the third current value are lower than the second current value.

12. An arrangement according to claim 11, wherein at least two current source circuits are provided on the switch input, which in turn are controlled depending on the switching condition of the switch element in the load circuit.

13. An arrangement according to claim 11, wherein a smoothing element, such as an RC low pass, is connected to the input of the switching device, and the smoothing element rounds the edges when switching over between the current values.

14. An arrangement according to claim 11, wherein the voltage on the input of the switching device is monitored and wherein an effective current increase current value is above the first current value long as the voltage on the control input is either lower than a specified threshold voltage, or higher than the difference between the supply voltage and the threshold voltage.

15. An arrangement according to claim 11, wherein the arrangement is provided in a motor vehicle for modulated triggering of an essentially ohmic load element.

16. An arrangement according to claim 11, wherein the arrangement is provided in a motor vehicle for pulse-width modulated triggering of lamps in continuous lighting mode within a frequency range above 100 Hertz.

17. An arrangement according to claim 9, wherein the first specified threshold value is approximately 10%.

18. An arrangement according to claim 9, wherein the third specified threshold value is approximately 80%.

19. An arrangement according to claim 9, wherein the second specified threshold value is approximately 90%.

* * * * *